US008859069B2

(12) United States Patent
Kim

(10) Patent No.: US 8,859,069 B2
(45) Date of Patent: Oct. 14, 2014

(54) METAL SHEET FOR ENCAPSULATING ORGANIC LIGHT-EMITTING DISPLAY DEVICE AND ENCAPSULATING METHOD OF ENCAPSULATION USING THE SAME

(71) Applicant: Jeong-Su Kim, Yongin (KR)

(72) Inventor: Jeong-Su Kim, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/756,953

(22) Filed: Feb. 1, 2013

(65) Prior Publication Data

US 2014/0124132 A1    May 8, 2014

(30) Foreign Application Priority Data

Nov. 5, 2012 (KR) .................. 10-2012-0124472

(51) Int. Cl.
 B32B 9/00  (2006.01)
 B32B 33/00  (2006.01)
 H01L 51/52  (2006.01)

(52) U.S. Cl.
 CPC ............ *H01L 51/5237* (2013.01); *H01L 51/52* (2013.01); *C09J 2201/128* (2013.01); *C09J 2400/163* (2013.01)
 USPC ......... 428/40.1; 428/40.9; 428/41.1; 156/248

(58) Field of Classification Search
 CPC ...... C09J 2201/128; C09J 7/02; C09J 7/0264; C09J 7/0292; C09J 2400/163; A61B 5/6832; A61B 5/6833; H01L 2924/12044; H01L 2251/5338; G06F 1/133308
 USPC ........................ 428/40.1, 40.9, 41.1; 156/248
 See application file for complete search history.

(56) References Cited

U.S. PATENT DOCUMENTS 4,379,596 A * 4/1983 Green et al. ............... 301/5.21
7,649,666 B2 * 1/2010 Isobe et al. .................. 359/245
2006/0108050 A1   5/2006 Satake et al.

FOREIGN PATENT DOCUMENTS

| JP | 1994-048690 U | 7/1994 |
| JP | 2001-253444 A | 9/2001 |
| KR | 10-2007-0103472 A | 10/2007 |
| WO | WO 2012-047590 A1 * | 4/2012 |

* cited by examiner

*Primary Examiner* — Patricia L Nordmeyer
(74) *Attorney, Agent, or Firm* — Lee & Morse, P.C.

(57) ABSTRACT

A metal sheet for encapsulating an organic light-emitting display device, the metal sheet including a main body, first and second adhesive layers respectively formed on both surfaces of the main body, and first and second releasing films that respectively protect the first and second adhesive layers by covering them. A portion of an outer line of the first adhesive layer passes an inner region of the second adhesive layer.

14 Claims, 4 Drawing Sheets

METAL SHEET FOR ENCAPSULATING ORGANIC LIGHT-EMITTING DISPLAY DEVICE AND ENCAPSULATING METHOD OF ENCAPSULATION USING THE SAME

CROSS-REFERENCE TO RELATED APPLICATION

This application claims the benefit of Korean Patent Application No. 10-2012-0124472, filed on Nov. 5, 2012, in the Korean Intellectual Property Office, and entitled: "METAL SHEET FOR ENCAPSULATING ORGANIC LIGHT-EMITTING DISPLAY DEVICE AND ENCAPSULATING METHOD OF ENCAPSULATION USING THE SAME," the disclosure of which is incorporated by reference herein in its entirety.

BACKGROUND

1. Field

Embodiments relate to a metal sheet for encapsulating an organic light-emitting display device and a method of encapsulating using the same, and more particularly, to a metal sheet with a structure for removing a releasing film and a method of encapsulating using the same.

2. Description of the Related Art

Generally, many studies have been conducted about a thin film and flexible organic light-emitting display device due to its driving characteristics. However, a display unit of the organic light-emitting display device may be degraded due to the penetration of moisture. Accordingly, an encapsulating structure for substantially preventing external moisture from penetrating into the display unit is needed to protect the display unit.

A sealing structure in which an encapsulation substrate formed of a glass material covering a base substrate on which the display unit is formed may be generally employed. An encapsulation structure in which a metal sheet is attached to an encapsulation substrate to effectively dissipate heat generated from the display unit may be preferably employed. The metal sheet has a structure in which both sides of a main body include adhesive layers, and thus, the adhesive layer on a side is attached to an encapsulation substrate as described above and the adhesive layer on the other side is attached to a part to be attached on the base substrate.

When a metal sheet is attached to an encapsulation substrate, a process of detaching a releasing film that covers the adhesive layer is performed in a state that the metal sheet is fixed on a work table. However, in this process, the releasing film is not cleanly detached from the adhesive layer, that is, the main body of the metal sheet itself is detached together with the releasing film only leaving the adhesive layer on the other side on the work table.

In this case, the detaching work is not smoothly performed resulting in a low productivity, and thus, there is a need to develop a method to address this problem.

SUMMARY

Embodiments are directed to a metal sheet for encapsulating an organic light-emitting display device, the metal sheet including a main body, first and second adhesive layers respectively formed on both surfaces of the main body, and first and second releasing films that respectively protect the first and second adhesive layers by covering them, wherein a portion of an outer line of the first adhesive layer passes an inner region of the second adhesive layer.

The first adhesive layer may have an area greater than that of the second adhesive layer.

The portion of the first adhesive layer where the outer line of the first adhesive layer passes the inner region of the second adhesive layer may be a pick-up point from which peeling of the first releasing film starts.

The outer line of the first adhesive layer at the pick-up point may be a punched area of a corner of the first adhesive layer as a specific figure shape.

The specific figure shape may include a triangular shape.

The first adhesive layer may be attached to an encapsulation substrate of the organic light-emitting display device.

The main body may include a metal layer and a resin layer.

The metal layer may include an aluminum layer, and the resin layer may include a PET layer.

Embodiments are also directed to a method of encapsulating an organic light-emitting display device, the method including preparing a metal sheet, attaching the metal sheet to an encapsulation substrate, and combining the encapsulation substrate with a base substrate on which a display unit is formed, wherein preparing the metal sheet includes respectively preparing a main body including a metal material, a first charge adhesive film having a first adhesive layer and a pair of first releasing films attached to both surfaces of thereof, and a second charge adhesive layer film having a second adhesive layer and a pair of second releasing films attached to both surfaces thereof, removing a portion of the first adhesive layer and one of the pair of the first releasing films by punching them so that a side of an outer line of the first adhesive layer of the first charge adhesive film passes through an inner region of the second adhesive layer, attaching the first adhesive layer to a first surface of the main body after detaching the one of the first releasing films, a portion of which is removed by punching, punching the second adhesive layer and one of the pair of the second releasing films so that an outer line of the second adhesive layer of the second charge adhesive layer film corresponds to an area of the display unit, and attaching the second adhesive layer to a second surface of the main body after detaching the one of the second releasing films from a punched side of the second adhesive layer.

Attaching the metal sheet to the encapsulation substrate may include detaching a remaining first releasing film by picking up from a portion thereof on which the portion of the first adhesive layer is punched; and attaching the first adhesive layer from which the remaining first releasing film is removed to the encapsulation substrate.

Combining the encapsulation substrate with the base substrate on which the display unit is formed may include detaching a remaining second releasing film; and combining the encapsulation substrate with the base substrate so that the second adhesive layer from which the remaining second releasing film is removed is attached to a contact unit on the base substrate.

The contact unit may be a passivation layer on the display unit.

In the prepared metal sheet, the first adhesive layer may have an area greater than that of the second adhesive layer.

The portion of the side of the first adhesive layer may be removed by punching a corner of the first adhesive layer in a specific figure shape.

The specific figure shape may include a triangular shape.

The main body may include a metal layer and a resin layer.

The metal layer may include an aluminum layer and the resin layer may include a PET layer.

BRIEF DESCRIPTION OF THE DRAWINGS

The above and other features and advantages of the embodiments will become more apparent by describing in detail exemplary embodiments thereof with reference to the attached drawings in which.

DETAILED DESCRIPTION

Embodiments will now be described more fully with reference to the accompanying drawings in which exemplary embodiments are shown.

Figure 1:
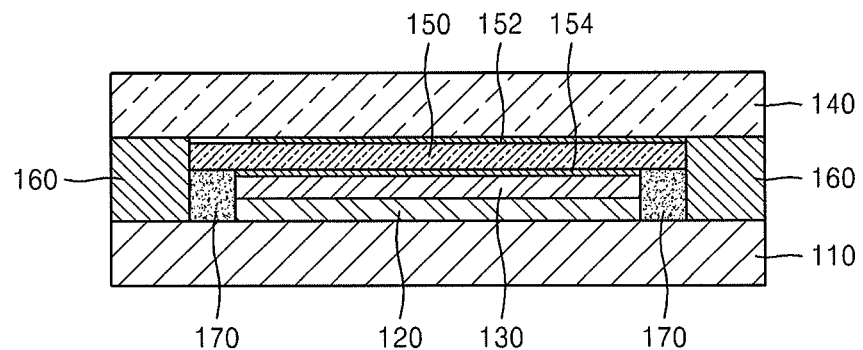
FIG. 1 is a cross-sectional view of an organic light-emitting display device according to an embodiment.

FIG. 1 is a cross-sectional view of an organic light-emitting display device according to an embodiment.

Referring to FIG. 1, the organic light-emitting display device according to the current embodiment includes a base substrate 110, a display unit 120 formed on the base substrate 110, and an encapsulation substrate 140 that covers the display unit 120.

The display unit 120 may be an organic light-emitting unit in which an organic layer is formed between a pair of electrodes facing each other.

The encapsulation substrate 140 covers the display unit 120 to substantially prevent external moisture from penetrating into the display unit 120, and a metal sheet 150 is attached on an inner surface thereof to increase heat dissipating efficiency. First and second adhesive layers 152 and 154 are formed on both surface of the metal sheet 150. The detailed structure of the metal sheet 150 will be described below.

The organic light-emitting display device also includes a sealant 160 that seals between the base substrate 110 and the encapsulation substrate 140, and may be formed of a material such as frit.

Frit is a glass material member which is a raw material of glass, and has a characteristic of hardening by a laser exposure. Thus, after combining the base substrate 110 and the encapsulation substrate 140, fit is coated on a region and a laser is irradiated onto the corresponding region, then frit tightly seals between the two members by hardening.

The organic light-emitting display device also may include a passivation layer 130 which is a protective film for protecting the display unit 120 from heat and moisture, and also may include a moisture getter 170.

In a process of manufacturing the organic light-emitting display device, as described above, when the metal sheet 150 is attached to the encapsulation substrate 140, a process of detaching a releasing film from the metal sheet 150 is included. At this point, if the releasing film is not smoothly detached, there is a production problem such as a production delay. In the current embodiment, the structure of the metal sheet 150 is improved to avoid the above problem. Hereinafter, the improved structure of the metal sheet 150 and a process of mounting the metal sheet 150 will be described.

Figure 2A:
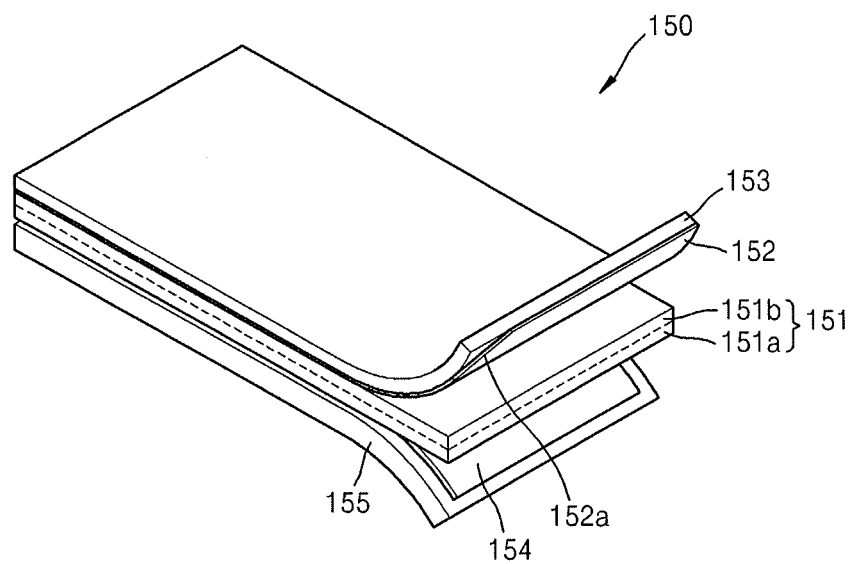
FIGS. 2A and 2B are respectively a perspective view and a plan view of a metal sheet according to an embodiment.
Figure 2B:
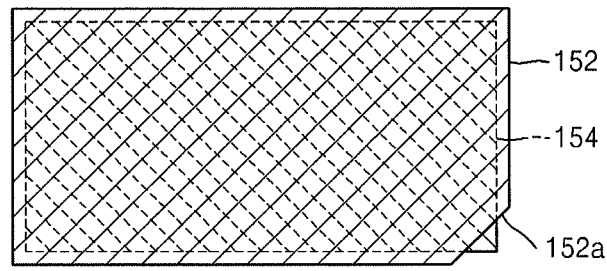

FIGS. 2A and 2B are respectively a perspective view and a plan view of the metal sheet 150 according to an embodiment. As it is shown in FIGS. 2A and 2B, the metal sheet 150 includes a main body 151, and first and second adhesive layers 152 and 154 respectively attached to both of the main body 151, first and second releasing films 153 and 155 that respectively protect the first and second adhesive layers 152 and 154. Here, the first adhesive layer 152 is attached to an inner surface of the encapsulation substrate 140, and the second adhesive layer 154 is attached to the passivation layer 130 when the encapsulation substrate 140 is combined with the base substrate 110.

Here, the second adhesive layer 154 is formed to have a size corresponding to a region of the passivation layer 130 that is attached to the second adhesive layer 154, that is, a region of the display unit 120. As depicted in FIG. 1, since the moisture getter 170 is formed outside the display unit 120, a region for forming the moisture getter 170 should be ensured. Therefore, the second adhesive layer 154 is formed to have an area corresponding to the area of the display unit 120.

Also, since the first adhesive layer 152 is an adhesive layer that allows the metal sheet 150 to be attached to the encapsulation substrate 140, the first adhesive layer 152 is formed to have an area equal to the area of the main body 151. Accordingly, when the first and second adhesive layers 152 and 154 are viewed by overlapping them on a plane, as depicted in FIG. 2B, it is a shape in which an outer line of the first adhesive layer 152 is formed outside the second adhesive layer 154.

However, as depicted in FIGS. 2A and 2B, a punched portion having a specific figure shape, e.g., a triangular shape (hereinafter, a pick-up point 152a) is formed as one of the corners of the first adhesive layer 152. Accordingly, the outer line of the first adhesive layer 152 is formed generally outside of the second adhesive layer 154, but at the pick-up point 152a, the outer line of the first adhesive layer 152 passes an inside of the second adhesive layer 154. The reason why a corner of the first adhesive layer 152 is punched as a triangular shape is to detach the first releasing film 153 from the pick-up point 152a when the first releasing film 153 is peeled away, and also, to substantially prevent detaching other layers including the main body 151 from the metal sheet 150. From the pick-up point 152a standpoint, the first releasing film 153 is removed from the first adhesive layer 152, and thus, naturally the adhesive force of the second adhesive layer 154 is acted greater than the adhesive force of the first adhesive layer 152. Accordingly, when the first releasing film 153 is detached from the pick-up point 152a, a lifting phenomenon of the main body 151 along the first releasing film 153 does not occur since the force of the second adhesive layer 154 for holding the main body 151 is greater than the force of the first releasing film 153 for dragging the main body 151. Once the peeling away at the pick-up point 152a starts smoothly, the remaining work for peeling the whole first releasing film 153 may be smoothly performed.

A method of manufacturing the metal sheet 150 having the structure described above and a method of manufacturing an organic light-emitting display device including the metal sheet 150 are as follows.

Figure 3A:
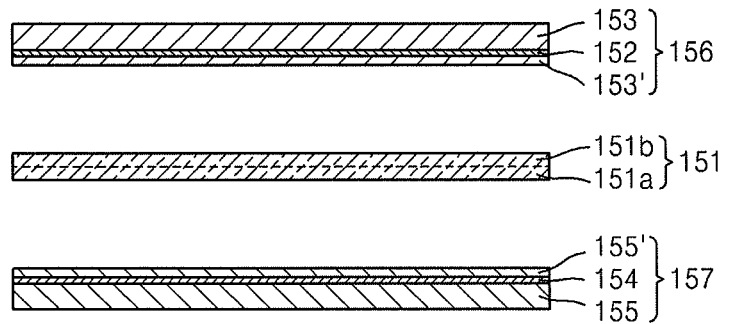
FIGS. 3A, 3B, 3C, 3D, 3E, 3F, and 3G are cross-sectional views showing a method of manufacturing an organic light-emitting display device by preparing the metal sheet depicted in FIGS. 2A and 2B.
Figure 3B:
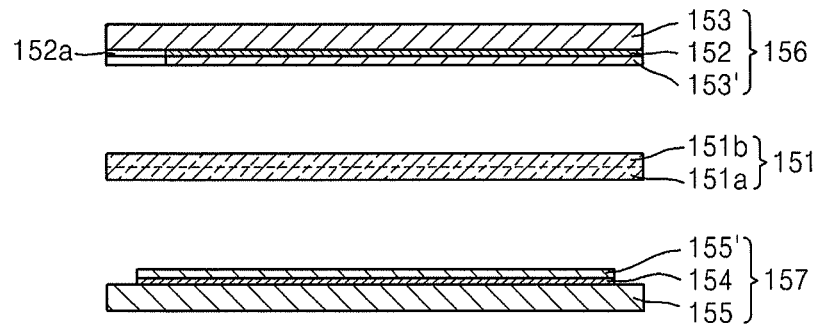

First, as depicted in FIG. 3A, the main body 151, a first charge adhesive film 156, and a second charge adhesive layer film 157 which constitute the metal sheet 150 are prepared.

The main body 151 may have a structure in which a PET layer 151b which is a resin layer is stacked on an aluminum layer 151a which is a metal layer.

The first charge adhesive film 156 has a structure in which a pair of first releasing films 153 and 153' are attached to both surfaces of the first adhesive layer 152. The second charge adhesive layer film 157 has a structure in which a pair of second releasing films 155 and 155' are attached to both surfaces of the second adhesive layer 154.

When the constituent elements described are prepared, as described above, the pick-up point 152a is formed on the first charge adhesive film 156 by punching the first charge adhesive film 156. At this point, the pick-up point 152*a* is formed by punching the first adhesive layer 152 together with one of the first releasing films 153 and 153'.

As described above, with regard to the second charge adhesive layer film 157, the second adhesive layer 154 is punched as a size corresponding to the region of the display unit 120. At this point, the size is cut by punching the second adhesive layer 154 together with one of the second releasing films 155 and 155'.

Figure 3C:
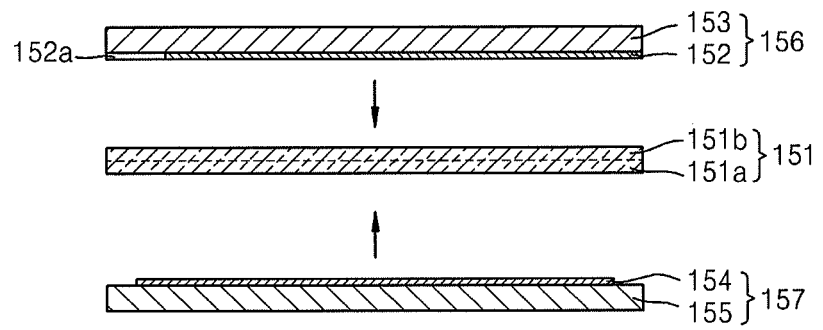
Figure 3D:
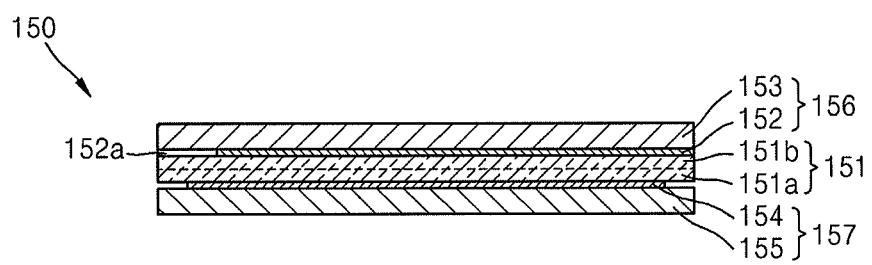

Next, the first and second releasing films 153' and 155' punched together with the first and second adhesive layers 152 and 154 are respectively detached. Afterwards, as depicted in FIG. 3C, the first charge adhesive film 156 and the second charge adhesive layer film 157 are attached to the main body 151. Then, the metal sheet 150 as depicted in FIG. 3D is prepared.

Figure 3E:
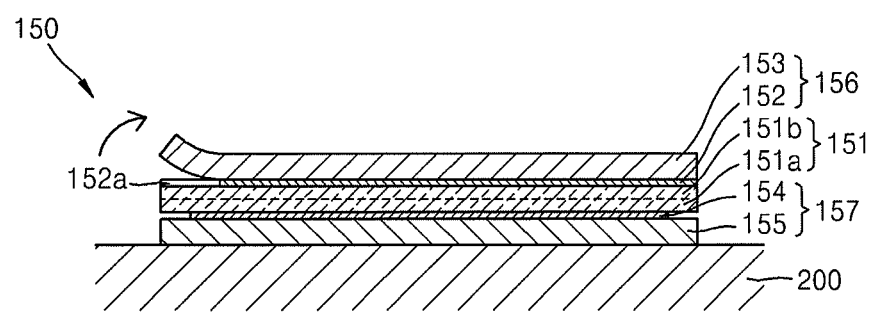

Afterwards, in order to attach the metal sheet 150 prepared as above to the encapsulation substrate 140, the remaining first releasing film 153 should be detached from the first adhesive layer 152. For this work, as depicted in FIG. 3E, the metal sheet 150 is fixed on a work table 200 by, for example, adsorption, the first releasing film 153 is detached from the pick-up point 152*a*. At this point, as described above, at the pick-up point 152*a*, the force of the second adhesive layer 154 for holding the main body 151 is greater than the force of the first releasing film 153 for dragging the main body 151, and thus, the phenomenon of lifting the main body 151 along the first releasing film 153 does not occur. Once, the peeling away at the pick-up point 152*a* starts smoothly, the remaining work for peeling the whole first releasing film 153 may be smoothly performed.

Figure 3F:
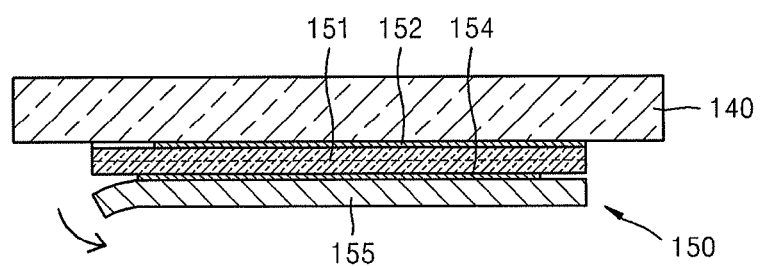

After the first releasing film 153 is removed, as depicted in FIG. 3F, the first adhesive layer 152 is attached to the encapsulation substrate 140. Then, the encapsulation substrate 140 to which the metal sheet 150 is attached is prepared.

Figure 3G:
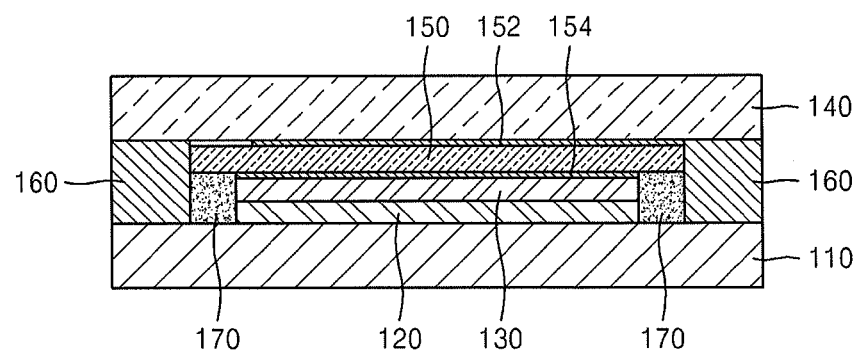

Next, after removing the second releasing film 155, as depicted in FIG. 3G, the encapsulation substrate 140 is attached to the base substrate 110 on which the display unit 120, the passivation layer 130, the sealants 160, and the moisture getter 170 are formed. Then, the second adhesive layer 154 is attached to the passivation layer 130, and a space between the base substrate 110 and the encapsulation substrate 140 is tightly sealed by the sealants 160.

Accordingly, when an organic light-emitting display device is formed through a process described above, a releasing film of a metal sheet may be smoothly detached by using a pick-up point of an adhesive layer that is punched in a triangular shape, and thus, the problem of low productivity due to detaching failure of the releasing film may be removed.

While exemplary embodiments have been particularly shown and described above, it will be understood by those of ordinary skill in the art that various changes in form and details may be made therein without departing from the spirit and scope of the present invention as defined by the following claims.

What is claimed is:

1. A metal sheet for encapsulating an organic light-emitting display device, the metal sheet comprising:
    a main body including metal;
    first and second adhesive layers respectively formed on both surfaces of the main body; and
    first and second releasing films that respectively protect the first and second adhesive layers by covering them,
    wherein:
        when the metal sheet is viewed in plan view, an outer periphery of the first adhesive layer is located outside of an outer periphery of the second adhesive layer, except for a portion of the outer periphery of the first adhesive layer located within the outer periphery of the second adhesive layer;
        the portion of the first adhesive layer where the outer periphery of the first adhesive layer is located within the outer periphery of the second adhesive layer is a point from which peeling of the first releasing film starts;
        the outer periphery of the first adhesive layer located within the outer periphery of the second adhesive layer is formed by removing an area of a corner of the first adhesive layer; and
        the first adhesive layer is attachable to an encapsulation substrate of the organic light-emitting display device following removal of the first releasing film.

2. The metal sheet of claim 1, wherein the first adhesive layer has an area greater than that of the second adhesive layer.

3. The metal sheet of claim 1, wherein the removed area of the corner of the first adhesive layer includes a triangular shape.

4. The metal sheet of claim 1, wherein the main body includes a metal layer and a resin layer.

5. The metal sheet of claim 4, wherein the metal layer includes an aluminum layer, and the resin layer includes a polyethylene terephthalate layer.

6. A method of preparing the metal sheet of claim 1, wherein the method comprises:
    respectively preparing a main body including a metal material, a first charge adhesive film having a first adhesive layer and a pair of first releasing films attached to both surfaces of thereof, and a second charge adhesive layer film having a second adhesive layer and a pair of second releasing films attached to both surfaces thereof;
    removing a portion of the first adhesive layer and one of the pair of the first releasing films by punching them so that, when the metal sheet is viewed in plan view, a side of an outer periphery of the first adhesive layer of the first charge adhesive film is located within an outer periphery of the second adhesive layer;
    attaching the first adhesive layer to a first surface of the main body after detaching the one of the first releasing films, a portion of which is removed by punching;
    punching the second adhesive layer and one of the pair of the second releasing films so that an outer periphery of the second adhesive layer of the second charge adhesive layer film corresponds to an area of the display unit; and
    attaching the second adhesive layer to a second surface of the main body after detaching the one of the second releasing films from a punched side of the second adhesive layer.

7. A method of encapsulating an organic light-emitting display device, the method comprising:
    preparing a metal sheet according to the method of claim 6;
    detaching a remaining first releasing film by picking up from a portion thereof on which the portion of the first adhesive layer is punched; and
    attaching the first adhesive layer from which the remaining first releasing film is removed to an encapsulation substrate.

8. The method of claim 7, further comprising:
    detaching a remaining second releasing film; and
    combining the encapsulation substrate with a base substrate on which the display unit is formed so that the second adhesive layer from which the remaining second releasing film is removed is attached to a contact unit on the base substrate.

9. The method of claim 8, wherein the contact unit is a passivation layer on the display unit.

10. The method of claim 6, wherein, in the prepared metal sheet, the first adhesive layer has an area greater than that of the second adhesive layer.

11. The method of claim 6, wherein the portion of the side of the first adhesive layer is removed by punching a corner of the first adhesive layer.

12. The method of claim 11, wherein the removed portion of the side of the first adhesive layer includes a triangular shape.

13. The method of claim 6, wherein the main body includes a metal layer and a resin layer.

14. The method of claim 13, wherein the metal layer includes an aluminum layer and the resin layer includes a PET layer.

* * * * *